United States Patent
Yuasa

(10) Patent No.: US 7,072,798 B2
(45) Date of Patent: Jul. 4, 2006

(54) SEMICONDUCTOR FABRICATING APPARATUS

(75) Inventor: Mitsuhiro Yuasa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 56 days.

(21) Appl. No.: 10/772,304

(22) Filed: Feb. 6, 2004

(65) Prior Publication Data

US 2004/0214435 A1    Oct. 28, 2004

(30) Foreign Application Priority Data

Feb. 7, 2003    (JP)    ............................. 2003-031111

(51) Int. Cl.
*G06F 19/00* (2006.01)
(52) U.S. Cl. ............................ 702/184; 438/5; 700/121
(58) Field of Classification Search ................ 702/184, 702/182, 183, 185; 700/121; 438/14, 5; 156/345.24; 73/570, 579
See application file for complete search history.

(56) References Cited

U.S. PATENT DOCUMENTS

| | | | | |
|---|---|---|---|---|
| 5,056,355 A | * | 10/1991 | Hepher et al. | 73/24.03 |
| 5,910,700 A | * | 6/1999 | Crotzer | 310/338 |
| 5,948,983 A | * | 9/1999 | Gogol et al. | 73/579 |
| 6,510,727 B1 | * | 1/2003 | Reiter et al. | 73/24.03 |
| 6,701,202 B1 | * | 3/2004 | Nakano et al. | 700/108 |
| 6,714,833 B1 | * | 3/2004 | Nakano et al. | 700/121 |
| 6,795,796 B1 | * | 9/2004 | Nakano et al. | 702/182 |
| 6,830,650 B1 | * | 12/2004 | Roche et al. | 156/345.24 |
| 6,866,744 B1 | * | 3/2005 | Miya et al. | 156/345.24 |
| 6,899,766 B1 | * | 5/2005 | Miya et al. | 134/1 |
| 2003/0205326 A1 | * | 11/2003 | Miya et al. | 156/345.24 |
| 2004/0007326 A1 | * | 1/2004 | Roche et al. | 156/345.24 |
| 2004/0159401 A1 | * | 8/2004 | Miya et al. | 156/345.24 |
| 2005/0011611 A1 | * | 1/2005 | Mahoney et al. | 156/345.24 |
| 2005/0039852 A1 | * | 2/2005 | Roche et al. | 156/345.24 |
| 2005/0049499 A1 | * | 3/2005 | Kaplan | 600/438 |

FOREIGN PATENT DOCUMENTS

| | | |
|---|---|---|
| JP | 61092020 A | 5/1986 |
| JP | 09171992 A | 6/1997 |
| JP | 2001-59808 | 3/2001 |
| JP | 2001196889 A | 7/2001 |
| JP | 2002200599 A | 7/2002 |
| JP | 2002-261001 | 9/2002 |

OTHER PUBLICATIONS

Japanese Office Action issued in corresponding application No. 2003-031111.

* cited by examiner

*Primary Examiner*—Patrick J. Assouad
(74) *Attorney, Agent, or Firm*—Finnegan, Henderson, Farabow, Garrett, Dunner, L.L.P.

(57) ABSTRACT

A resonant frequency sensor is disposed in a plasma-processing chamber included in a semiconductor fabricating apparatus. A change in the resonant frequency caused by etching, sputtering or deposition is sensed in order to detect the timing of performing the maintenance of the processing chamber. If data representing the relationship between an amount of etching or deposition occurring at a predetermined position in the processing chamber and occurrence of an abnormality is produced in advance, an optimal maintenance timing can be determined.

6 Claims, 2 Drawing Sheets

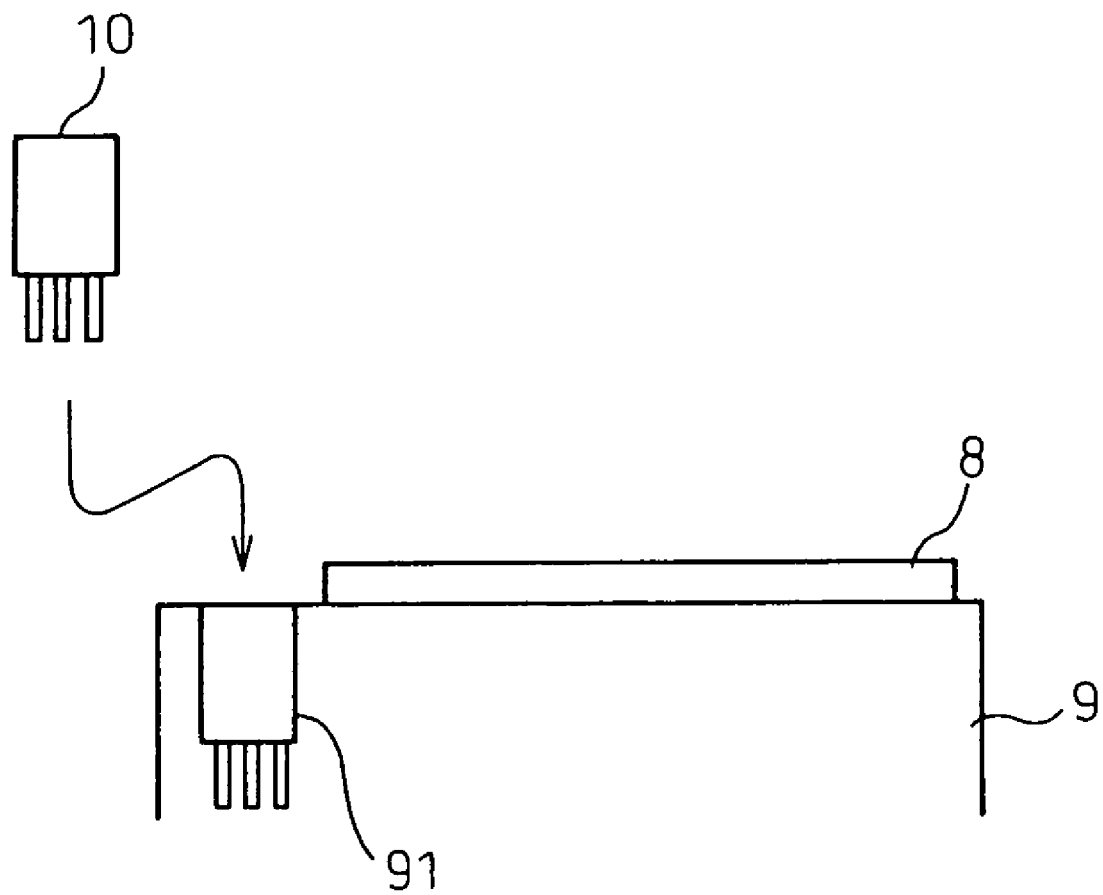

SEMICONDUCTOR FABRICATING APPARATUS

BACKGROUND OF THE INVENTION

1. Field of the Invention

The present invention relates to a semiconductor fabricating apparatus including a maintenance monitor that determines the timing of performing the maintenance of a semiconductor processing chamber.

2. Description of the Related Art

A semiconductor fabricating apparatus is a very delicate machine. If the state of a processing chamber in which wafers are processed varies, the characteristics of semiconductors vary greatly. For example, in a plasma-processing apparatus, a material in a chamber, which is etched or removed through etching or sputtering may generate an abnormal electric discharge. Raw gas or a reactive product deposited in the chamber may generate particles to degrade a process yield.

Consequently, for plasma processing, performed as one semiconductor fabricating process, after a predetermined number of wafers has been processed, a plasma-processing chamber is left open in order to perform maintenance work that includes exchanging parts and wet cleaning. Conventionally, semiconductor memories, such as DRAMs, are fabricated through mass production. The maintenance timing is therefore determined experimentally. Moreover, sampling inspection may be performed on processed wafers in order to check if the uniformity in handling wafers fluctuates during one process, or a particle monitor may be used for measurement. Based on the result of the check or measurement, the timing of parts exchange or cleaning may be determined (refer to, for example, Japanese Unexamined Patent Application Publication No. 2001-59808).

However, limited production of diversified products has come to be adopted more frequently in recent years. The frequency of performing different processes in the same processing chamber is also higher. If a kind of product differs from lot to lot, it is hard to determine the timing for performing maintenance work. If maintenance is performed because of process condition fluctuation or particle generation, or if maintenance is performed in an early stage with a large margin preserved, unnecessary costs will occur.

Japanese Unexamined Patent Application Publication No. 2002-261001 has disclosed a technology that measures a degree of contamination by making the most of the fact that the frequency of oscillation of a crystal oscillator changes due to a contaminant film formed on the crystal oscillator. However, it is hard to use the crystal oscillator in an environment for plasma processing of semiconductor fabricating process. Moreover, the crystal oscillator is suitable for detection of a minute change that is of the level of a change in the thickness of a molecular film. However, the crystal oscillator is unsuitable for detection of a change in the thickness of a film, which is several micrometers or more, occurring during etching of an oxide or during forming of a layer.

SUMMARY OF THE INVENTION

Accordingly, an object of the present invention is to provide a semiconductor fabricating apparatus that includes a maintenance monitor capable of detecting the optimal timing of performing the maintenance of a plasma-processing chamber.

According to the present invention, a resonant frequency sensor that determines the maintenance timing is disposed in a processing chamber included in a semiconductor fabricating apparatus.

If a sensor fabricated as a micro machine is adopted as the resonant frequency sensor, the resonant frequency sensor can be designed quite compactly. High-sensitivity measurement can also be achieved.

Moreover, if correlation data concerning the correlation between an amount of etching or deposition occurring at a predetermined position in the processing chamber and occurrence of an abnormality is produced in advance, the optimal maintenance timing can be determined.

According to the present invention, the resonant frequency sensor is disposed in the plasma-processing chamber and monitored, whereby the appropriate maintenance timing can be determined. Moreover, the system operating time can be utilized effectively, and a decrease in a process yield deriving from insufficient maintenance can be prevented.

BRIEF DESCRIPTION OF THE DRAWINGS

Other features and advantages will become apparent in discussion of the embodiments of the invention in relation to the following drawings:

FIG. 3 schematically shows another example of disposition of the resonant frequency sensor employed in the embodiment of the present invention.

DESCRIPTION OF THE PREFERRED EMBODIMENTS

Figure 1:
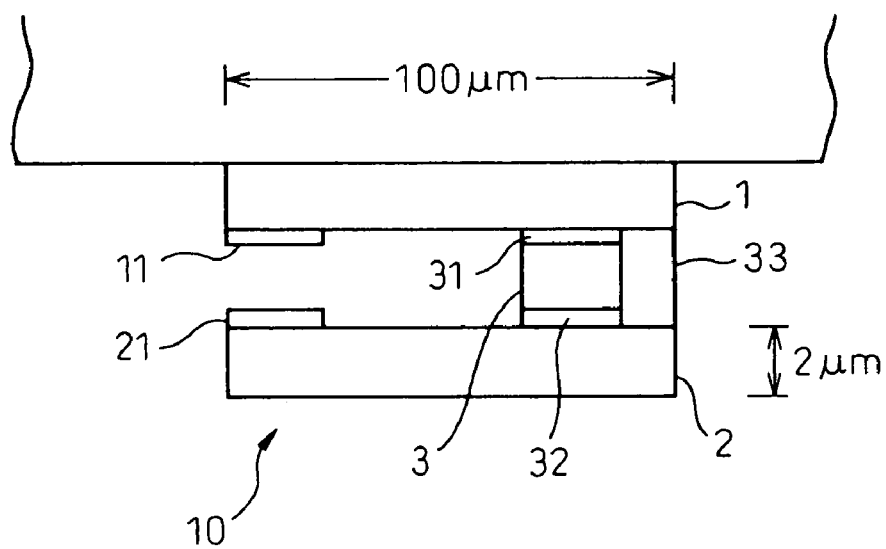
FIG. 1 schematically shows a resonant frequency sensor employed in an embodiment of the present invention.

Referring to the drawings, an embodiment of the present invention will be described below. FIG. 1 schematically shows a resonant frequency sensor 10 employed in the embodiment of the present invention.

The resonant frequency sensor 10 has a fixed part 1, which is fixed to a support, and a vibrated part 2, which is cantilevered via a piezoelectric element 3 or a joint 33, which are sandwiched between electrodes 31 and 32. An electrode 11 attached to the fixed part 1 and an electrode 21 attached to the vibrated part 2 are opposed to each other on one side of the resonant frequency center opposite to the other side thereof on which the piezoelectric element is located. The opposed electrodes 11 and 21 constitute a capacitor. In the present embodiment, the length in the longitudinal direction of the fixed part and vibrated part is approximately 100 µm, and the thickness thereof is approximately 2 µm.

The resonant frequency of the resonant frequency sensor 10 is obtained as a frequency at which capacitance between the electrodes 11 of the fixed part 1 and the electrodes 21 of the vibrated part 2 is changed at the maximum when an AC voltage having the frequency, such as in the form of sine wave, is applied to the electrodes 31 and 32 of the piezoelectric element 3 to vibrate the vibrated part 2. The weight of the resonant frequency sensor disposed in the plasma-processing chamber time-sequentially increases or decreases during plasma processing. In other words, during deposition, a reactive product is deposited on the sensor and the weight of the sensor increases. During etching, sputtering, or any other process, the sensor is etched and the weight thereof decreases. Accordingly, the resonant frequency shifts from the initial value. If the shift increases to fall outside a reference range, it is judged as the timing of maintenance.

The resonant frequency sensor 10 is preferably designed as a micro machine. A resonant frequency sensor fabricated through micro machining is so compact as to be inexpensive. A degree of etching or a degree of deposition that is normally 1 mm or less must be measured. As the mass of the vibrated part is small, the degree of etching or deposition can be measured with very high sensitivity. In the present embodiment, as the vibrated part 2 is approximately 2 μm thick, the degree of etching or deposition of approximately 1 μm can be sensed readily. Various proposals have been made of a method of fabricating a resonant frequency sensor through micro machining. An appropriate method can be adopted according to need.

As the resonant frequency sensor is preferably formed as a micro machine, silicon, silicon oxide or other silicon compound is adopted as a material made into the sensor. Consequently, a sensor made of an appropriate material is selected for each process. For example, a sensor to be used for a silicon etching process should be made of, for example, a silicon oxide.

In order to detect the maintenance timing accurately, an amount of etching or deposition occurring at a position at which the resonant frequency sensor 10 may be disposed can be obtained as reference data in advance. Specifically, it is measured and evaluated in advance to what degree a reactive product has deposited at each position in a plasma-processing chamber in a factory or a Laboratory, in which the semiconductor fabricating apparatus is fabricated, when particles are generated. Otherwise, it is measured and evaluated in advance to what degree etching is performed at each position in the plasma-processing chamber when abnormal discharge takes place. In this case, wherever the resonant frequency sensor 10 is disposed, the appropriate timing of performing the maintenance of the processing chamber can be determined through comparison with associated data. A database may be stored in a storage device associated with each fabricating apparatus. Otherwise, the database may be stored in a server other than the fabricating apparatus, and the server may be connected to the fabricating apparatus via a communication means.

Figure 2:
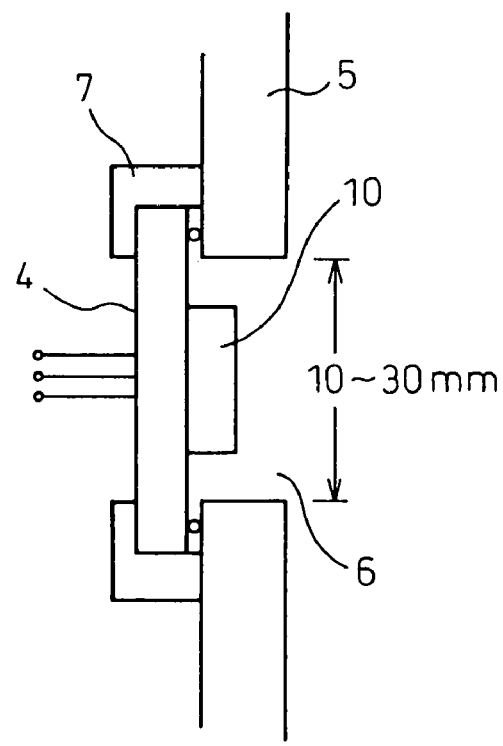
FIG. 2 schematically shows an example of disposition of the resonant frequency sensor employed in the embodiment of the present invention.

FIG. 2 and FIG. 3 schematically show the disposition of a maintenance monitor within a plasma-processing chamber.

Referring to FIG. 2, a through hole 6 is formed in the side wall 5 of the plasma-processing chamber. The resonant frequency sensor 10 is disposed in the through hole 6 so that it will be bombarded with plasma molecules. The support 4 is fixed to the side wall 5 with a clamping member 7 with an airtight O ring between them. The resonant frequency sensor 10 may be etched through plasma etching or a reactive product may be deposited on the resonant frequency sensor. The resonant frequency sensor 10 is therefore replaced with a new one at every time maintenance is performed.

Referring to FIG. 3, a receptacle 91 into which the resonant frequency sensor 10 is fitted is formed in a susceptor 9 on which a wafer 8 is mounted. The resonant frequency sensor 10 is fitted into the receptacle 91 for use. The resonant frequency sensor 10 is not limited to the foregoing example of disposition. The resonant frequency sensor 10 may be disposed in any place as long as it will be bombarded with plasma molecules.

When one lot is completed, the sensor is used to measure an amount of etching or deposition. The result of measurement is compared with data recorded in the system or contained in a database stored in a server connected to the system via communicating means. If the result of measurement falls outside a reference range, a maintenance request signal is generated in order to notify that the maintenance time has arrived.

What is claimed is:

1. A semiconductor fabricating apparatus having a resonant frequency sensor fabricated as a micro machine chip and disposed through a wall of a processing chamber, wherein a change in resonant frequency of said resonant frequency sensor is detected in order to determine a maintenance timing and the resonant frequency sensor includes:
   a fixed part having a first electrode;
   a vibrating part having a second electrode; and
   a piezoelectric joint configured to couple the fixed part and the vibrating part,
   wherein the resonant frequency of the resonant frequency sensor is determined by a capacitance between the first electrode and the second electrode.

2. The semiconductor fabricating apparatus according to claim 1, wherein:
   the relationship between an amount etching or deposition and chamber condition at a predetermined position in said processing chamber is stored in a database; and
   the change in the resonant frequency is compared with associated data recorded in said database in order to determine the maintenance timing.

3. The semiconductor fabricating apparatus according to claim 1, wherein the fixed part and the vibrating part are approximately 100 micrometer in length.

4. The semiconductor fabricating apparatus according to claim 1, wherein the vibrating part is approximately 2 micrometer in thickness.

5. The semiconductor fabricating apparatus according to claim 1, wherein the resonant frequency sensor is capable of detecting a degree of etching or deposition of approximately 1 micrometer.

6. The semiconductor fabricating apparatus according to claim 1, wherein the piezoelectric joint further includes:
   a first electrode;
   a second electrode, and
   a piezoelectric element sandwiched by the first electrode and the second electrode,
   wherein the first electrode and the second electrode are coupled to an AC voltage to vibrate the vibration part.

* * * * *